(12) United States Patent
Yan et al.

(10) Patent No.: US 11,481,610 B2
(45) Date of Patent: Oct. 25, 2022

(54) NEURO-BIONIC DEVICE BASED ON TWO-DIMENSIONAL TI$_3$C$_2$ MATERIAL AND PREPARATION METHOD THEREOF

(71) Applicant: Hebei University, Baoding (CN)

(72) Inventors: Xiaobing Yan, Baoding (CN); Kaiyang Wang, Baoding (CN); Deliang Ren, Baoding (CN)

(73) Assignee: HEBEI UNIVERSITY, Baoding (CN)

( * ) Notice: Subject to any disclaimer, the term of this patent is extended or adjusted under 35 U.S.C. 154(b) by 757 days.

(21) Appl. No.: 16/396,703

(22) Filed: Apr. 28, 2019

(65) Prior Publication Data

US 2020/0160155 A1    May 21, 2020

(30) Foreign Application Priority Data

Nov. 16, 2018  (CN) .......................... 201811367908.0

(51) Int. Cl.
*B82Y 20/00* (2011.01)
*A61N 1/05* (2006.01)
(Continued)

(52) U.S. Cl.
CPC .............. *G06N 3/061* (2013.01); *G11C 11/54* (2013.01); *G06N 3/049* (2013.01)

(58) Field of Classification Search
CPC ...... G06N 3/061; G06N 3/049; G06N 3/0635; G11C 11/54; G11C 2213/15;
(Continued)

(56) References Cited

U.S. PATENT DOCUMENTS

2004/0061841 A1* 4/2004 Black .................... C12Q 1/005
355/30
2005/0067277 A1* 3/2005 Pierce .................... C12Q 1/004
204/403.01
(Continued)

OTHER PUBLICATIONS

B. Rakhi et al: "Novel amperometric glucose biosensor based on MXene nanocomposite", Scientific Reports, vol. 6, No. 1, Nov. 10, 2016 (Nov. 10, 2016), XP055586773, DOI: 10.1038/srep36422 (Year: 2016).*

*Primary Examiner* — Brandon S Cole
(74) *Attorney, Agent, or Firm* — Bayramoglu Law Offices LLC (57) ABSTRACT

A neuro-bionic device based on a two-dimensional Ti$_3$C$_2$ material is provided. The device includes a Pt/Ti/SiO$_2$/Si substrate, a neuro-bionic layer formed on a Pt film layer of the Pt/Ti/SiO$_2$/Si substrate, and an Al electrode layer formed on the neuro-bionic layer. The neuro-bionic layer is made of a two-dimensional Ti$_3$C$_2$ material. The neuro-bionic device of the present invention is prepared by an evaporating coating method and a drop-coating method. The preparation process is relatively simple. The prepared device can successfully simulate the characteristics of synapse. More importantly, the resistance of the device can be modulated continuously under a scanning of a pulse sequence with pulse width and interval of 10 ns, which is beneficial to the application of the device in the ultrafast synapse simulation.

8 Claims, 6 Drawing Sheets

(51) Int. Cl.
*C23C 16/50* (2006.01)
*B82Y 10/00* (2011.01)
*G06N 3/06* (2006.01)
*G11C 11/54* (2006.01)
*G06N 3/04* (2006.01)

(58) Field of Classification Search
CPC ............ G11C 2213/35; G11C 13/0019; C04B 2235/79; C04B 35/5611; B82Y 10/00; H01L 45/04; H01L 45/1253; H01L 45/149; H01L 45/16
See application file for complete search history.

(56) References Cited

U.S. PATENT DOCUMENTS

| | | | |
|---|---|---|---|
| 2007/0212807 A1* | 9/2007 | Yamada | H01L 51/0545 |
| | | | 438/99 |
| 2010/0285514 A1* | 11/2010 | Claussen | C23C 28/345 |
| | | | 977/920 |
| 2018/0277756 A1* | 9/2018 | Li | H01L 45/1675 |
| 2020/0405165 A1* | 12/2020 | Vitale | A61N 1/05 |

* cited by examiner

NEURO-BIONIC DEVICE BASED ON TWO-DIMENSIONAL TI$_3$C$_2$ MATERIAL AND PREPARATION METHOD THEREOF

CROSS REFERENCE TO THE RELATED APPLICATIONS

This application is based upon and claims priority to Chinese Patent Application No. 201811367908.0, filed on Nov. 16, 2018, the entire contents of which are incorporated herein by reference.

TECHNICAL FIELD

The present invention relates to the technical field of neuro-bionic devices, in particular to a neuro-bionic device based on a two-dimensional Ti$_3$C$_2$ material and a preparation method thereof.

BACKGROUND

In traditional electronic computers, the bottleneck caused by Von Neumann architecture is the separation of a computing module from a storage module. This makes CPU read data from the storage module, and then process the data when executing a command, which results in excessive consumption of time and power for reading the data. In the face of this serious problem, previous studies found that the human brain had solved the problem. Because of the inherent fusion between storage and computing, interconnected neurons in the human brain can effectively handle complex tasks. Therefore, in order to simulate the characteristics of the brain, academia and industry personnel are exploring systems similar to the human brain. Thus, a non-conventional device is required for realizing an information storage and processing different from that of the Von Neumann architecture.

Memristor is a kind of non-linear resistor with a memory function, and is a device capable of simulating the brain and simulating to realize artificial synapses after extensive research. The memristor has an excellent data processing capability far superior than that of the current digital architecture. Moreover, the memristor can better simulate and calculate information on a biological scale. Currently, there are some reports on the memristor, i.e., a kind of synaptic bionic device. However, the bionic effect of the memristor is not ideal as per expectation, especially when the pulse width is reduced to a predetermined degree, the memristor is hard to be turned on for regulation. Therefore, it is of great significance to develop an ultrafast synaptic bionic device with a simple structure and a good bionic effect.

Two-dimensional materials have many unique properties, touching off a research upsurge. Due to the potential application of two-dimensional layered materials in the fields such as electrochemistry, researchers have been looking for new two-dimensional layered materials. In 2011, Naguib. M and other researchers used hydrofluoric acid to etch Ti$_3$AlC$_2$T$_x$ to remove the Al therein, thus forming a novel two-dimensional metal carbide known as Ti$_3$C$_2$T$_x$. At present, there is no report on the application of Ti$_3$C$_2$ material in the preparation of synaptic bionic device with a relatively good bionic effect.

SUMMARY

The first objective of the present invention is to provide a neuro-bionic device based on a two-dimensional Ti$_3$C$_2$ material, so as to solve the problem that the bionic effect of the existing device is not satisfactory.

The second objective of present invention is to provide a method of preparing a neuro-bionic device based on a two-dimensional Ti$_3$C$_2$ material.

The first objective of the present invention is realized as follows. A neuro-bionic device includes a Pt/Ti/SiO$_2$/Si substrate, a neuro-bionic layer formed on a Pt film layer of the Pt/Ti/SiO$_2$/Si substrate, and an Al electrode layer formed on the neuro-bionic layer. The neuro-bionic layer is made of a two-dimensional Ti$_3$C$_2$ material.

The neuro-bionic layer is prepared by a drop-coating method, and a thickness of the neuro-bionic layer is 5 nm-200 nm.

The Al electrode layer is prepared by an evaporation method, and the Al electrode layer includes a plurality of circular electrodes with a diameter of 80 μm-300 μm uniformly distributed on the neuro-bionic layer.

A thickness of each circular electrode is 50 nm-200 nm.

The Pt/Ti/SiO$_2$/Si substrate includes a Si layer, a SiO$_2$ layer, a Ti layer and a Pt layer from bottom to top.

The neuro-bionic device can be an electronic artificial synapse device.

The second objective of the present invention is realized as follows. A method of preparing a neuro-bionic device includes the following steps:

a. washing a Pt/Ti/SiO$_2$/Si substrate with acetone, alcohol and deionized water under an ultrasonic wave, successively; drying with nitrogen;

b. dissolving Ti$_3$C$_2$ powder in deionized water at a concentration of 5 mg/mL, shaking evenly, and then dissociating the Ti$_3$C$_2$ powder by the ultrasonic wave;

c. taking out a Ti$_3$C$_2$ solution after dissociated by the ultrasonic wave, rinsing the Ti$_3$C$_2$ solution by N$_2$ for sealing;

d. taking the Ti$_3$C$_2$ solution obtained in the step c by using a pasteur pipette, performing a drop coating of the Ti$_3$C$_2$ solution on a Pt film layer of the Pt/Ti/SiO$_2$/Si substrate, and drying under a nitrogen atmosphere, so as to form a neuro-bionic layer on the Pt/Ti/SiO$_2$/Si substrate;

e. putting the Pt/Ti/SiO$_2$/Si substrate formed with the neuro-bionic layer into an evaporation coating machine, placing a mask on the neuro-bionic layer, vacuumizing a cavity of the evaporation coating machine to $3 \times 10^{-3}$ Pa, adjusting the evaporation coating machine to an evaporating state, and adjusting an evaporation bombardment voltage, so as to form an Al electrode layer by an evaporation on the neuro-bionic layer.

In the step d, a thickness of the neuro-bionic layer is about 5 nm to 200 nm.

In the step e, circular holes with a diameter of 80 μm-300 μm are uniformly arranged on the mask, and a thickness of the Al electrode layer is 50 nm-200 nm.

In the step e, the evaporation bombardment voltage is slowly increased until a reading of an ammeter is 50 A for an evaporation coating.

In the present invention, a specific Al electrode layer is used to simulate a pre-synaptic membrane of a synapse, a Pt film layer is used to simulate a post-synaptic membrane of the synapse, and a corresponding Ti$_3$C$_2$ material is used as a neuro-bionic layer, so that two basic functions of the synapse (spike-timing-dependent plasticity and paired pulse facilitation) are simulated, and the bionic effect is good.

The resistance of the neuro-bionic device of the present invention can be controlled by applying a series of pulse sequences with different amplitudes and widths. The resistance change of the neuro-bionic device of the present invention can be controlled by applying pulses of different directions. Moreover, the neuro-bionic device of the present invention has stability and repeatability. The pulse amplitude can be reduced to 2 V, and the resistance of device can be continuously modulated under a series of pulse sequences with a pulse width and interval of 10 ns, which has a great importance to the application of ultrafast neural modulation.

DETAILED DESCRIPTION

Embodiment 1

Figure 1:
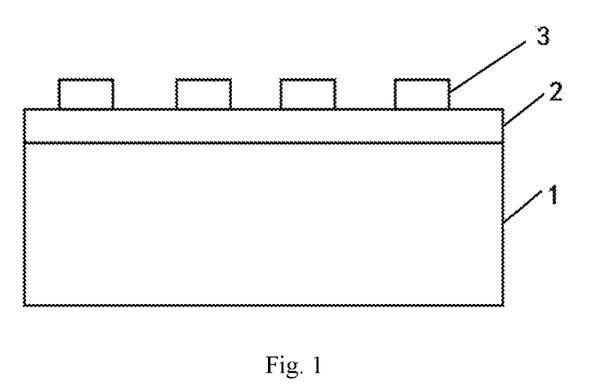
FIG. 1 is a structural diagram of a neuro-bionic device of the present invention.

As shown in FIG. 1, the neuro-bionic device of the present invention includes the Pt/Ti/SiO$_2$/Si substrate 1 at the bottom, the neuro-bionic layer 2 formed on the Pt/Ti/SiO$_2$/Si substrate 1, and the Al electrode layer 3 formed on the neuro-bionic layer 2. The Pt/Ti/SiO$_2$/Si substrate 1 includes the Si layer at the bottom, the SiO$_2$ layer on the Si layer, the Ti layer on the SiO$_2$ layer, and the Pt film layer on the Ti layer at the top. The neuro-bionic layer 2 is located on the Pt film layer.

The neuro-bionic layer 2 is a two-dimensional Ti$_3$C$_2$ material with a thickness of 150 nm.

The Al electrode layer 3 includes a plurality of uniformly distributed circular electrodes with a diameter of 90 μm, and a thickness of each circular electrode is 150 nm.

The method of preparing the neuro-bionic device shown in FIG. 1 includes the following steps:

(1) forming a neuro-bionic layer on a Pt/Ti/SiO$_2$/Si substrate

① the Pt/Ti/SiO$_2$/Si substrate is washed with acetone under an ultrasonic wave for 10 minutes, put into alcohol for an ultrasonic washing for 10 minutes, put into deionized water using a tweezer for an ultrasonic washing for 5 minutes, and finally placed on a dustless test paper and dried with nitrogen for storage;

② prepared Ti$_3$C$_2$ powder is dissolved in deionized water at a concentration of 5 mg/mL for shaking evenly, and then dissociated by the ultrasound wave for 30 minutes;

③ a solution after an ultrasonic treatment is taken out, and rinsed with nitrogen for sealing;

④ the solution is taken using a pasteur pipette, and drop coated on a Pt film layer of the Pt/Ti/SiO$_2$/Si substrate, and the Pt/Ti/SiO$_2$/Si substrate is placed overnight in a closed space filled with nitrogen to form the neuro-bionic layer with a thickness of 150 nm;

(2) preparing an Al electrode on the neuro-bionic layer

Figure 2:
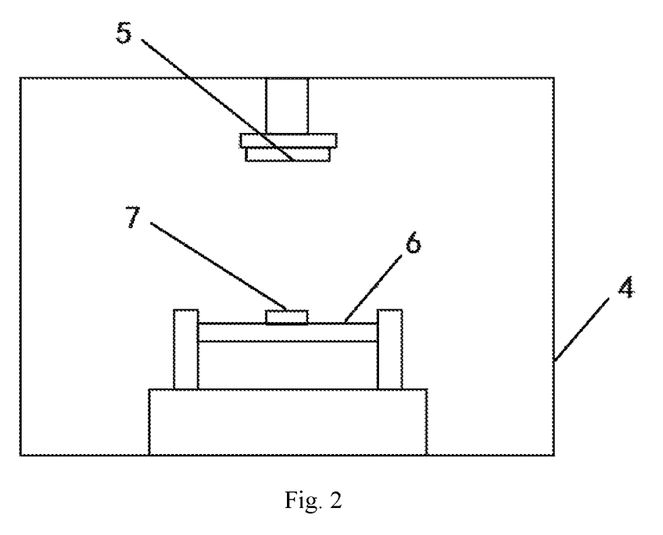
FIG. 2 is a structural diagram of an evaporation coating machine for preparing a neuro-bionic device.

① as shown in FIG. 2, the cavity 4 of the evaporation coating machine is opened, then the prepared neuro-bionic layer is placed on a mask with an aperture diameter of 90 and the mask is fixed on the substrate table 5 of the evaporation coating machine, the aluminum strip 7 having a length of 1.5 cm is placed into the molybdenum bar 6;

② a bell jar pressure and a system pressure of the evaporation coating machine is adjusted to 1.5 Pa by a mechanical pump, then the mechanical pump is converted into a diffusion pump state for a preheating for 60 minutes, and after the preheating, the bell jar pressure is adjusted to $3 \times 10^{-3}$ Pa;

③ when a vacuum degree reaches $3 \times 10^{-3}$ Pa, the evaporation coating machine is adjusted to an evaporation state, and a workpiece is rotated;

④ an evaporation bombardment voltage is increased slowly, when a reading of an evaporation bombardment ammeter is 50 A, an evaporation coating is performed to obtain the Al electrode having a thickness of 150 nm.

Contrast Example 1

The Al electrode layer is replaced by the Au electrode layer, and other parameters and preparation methods remain unchanged. The neuro-bionic device with the top layer of Au electrode layer is obtained.

Embodiment 2

The performance of the devices in Embodiment 1 and contrast example 1 are tested respectively.

Figure 3:
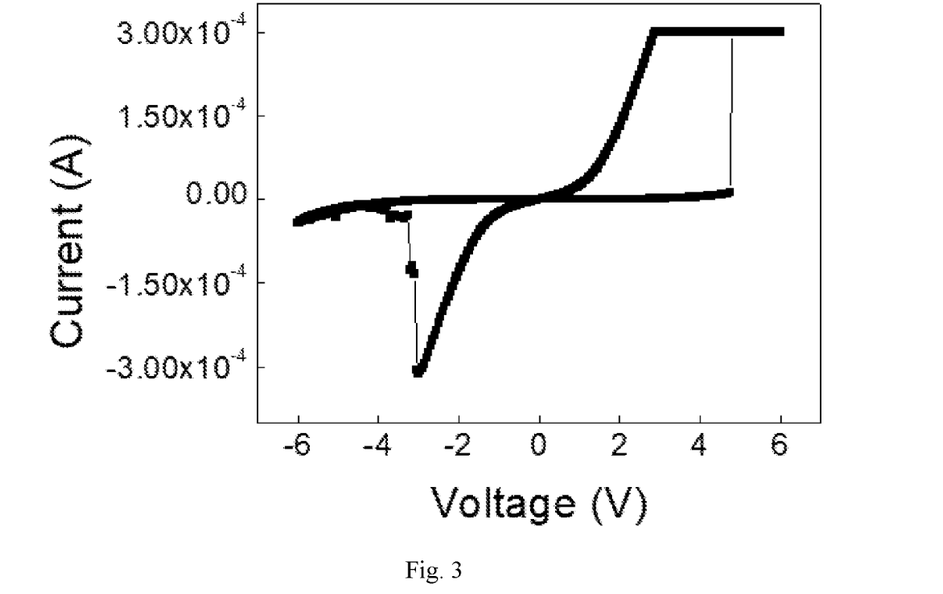
FIG. 3 shows a voltage-current characteristic curve of a neuro-bionic device of the present invention scanned under a voltage ranging from −6 V to 6 V at a limiting current of 300 μA.

As shown in FIG. 3, a voltage ranging from −6 V to 6 V is applied to the Al electrode layer of the neuro-bionic device in Embodiment 1 of the present invention. The voltage is increased from 0 V to 6 V, and then gradually reduced to 0 V, then, the voltage changes from 0 V to −6 V, and then changes gradually to 0 V. When the scanning voltage reaches about 4 V, the device suddenly changes from a high-resistance state to a low-resistance state. At this time, the resistance value of the neuro-bionic device remains at the low-resistance state. When the negative voltage applied on the Al electrode layer is increased to −4 V, the neuro-bionic device suddenly changes from the low-resistance state to the high-resistance state, and the device remains at the high-resistance state until the scanning voltage returns to 0 V.

Figure 4:
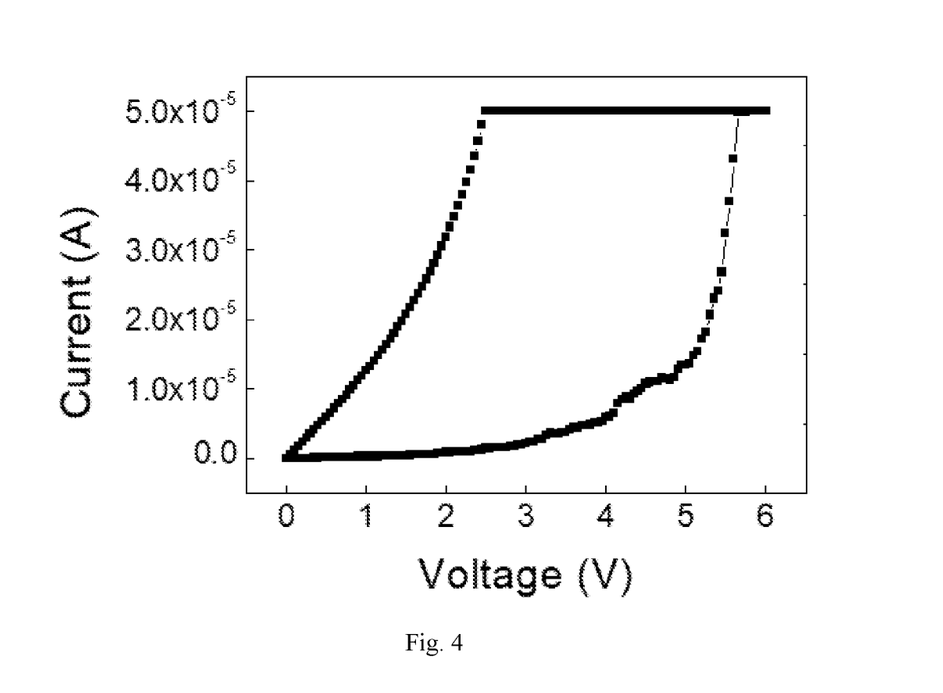
FIG. 4 shows a voltage-current characteristic curve of a neuro-bionic device of the present invention scanned under a voltage ranging from 0 V to 6 V at a limiting current of 50 μA.

As shown in FIG. 4, a low limiting current of 50 μA is used for voltage scanning the neuro-bionic device in Embodiment 1. The forward voltage is applied to the Al electrode layer, and the voltage is increased from 0 V to 6 V, and then gradually reduced to 0 V. The continuous changing voltage is used for scanning. When the voltage reaches about 4 V, the resistance value of the neuro-bionic device changes slowly from a high-resistance state to a low-resistance state. This change is more conducive to the simulation of synaptic function.

Figure 5:
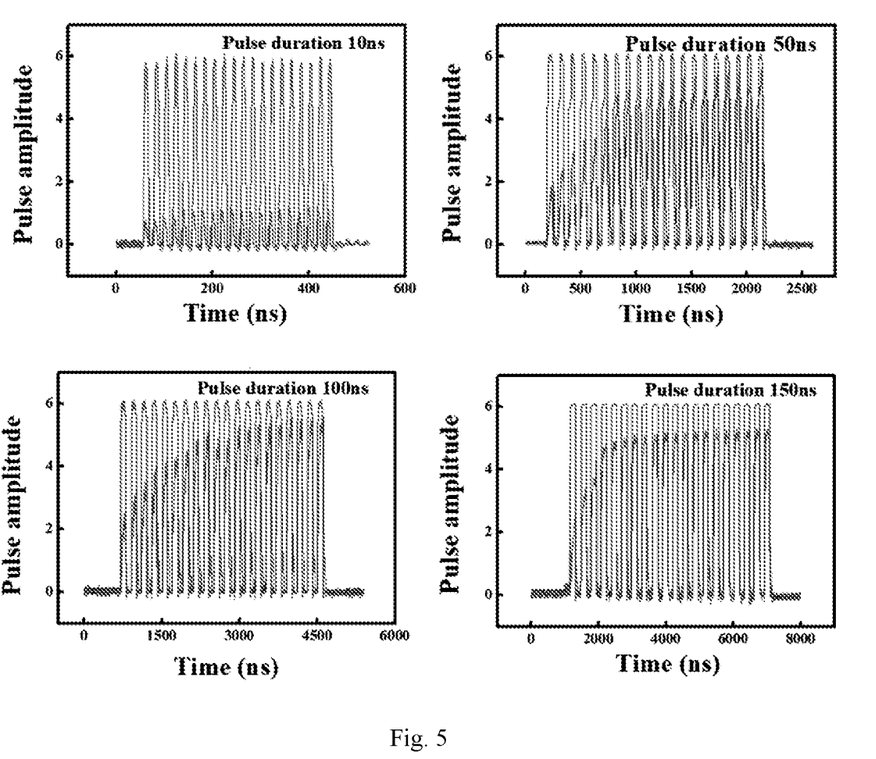
FIG. 5 shows a pulse waveform of an Au electrode layer of contrast example 1 when applied with a series of pulse sequences with different pulse widths.

As shown in FIG. 5, continuous pulses with different pulse widths are applied to the Au electrode layer of the neuro-bionic device in the contrast example 1, and the pulse widths are 50 ns, 100 ns, 150 ns, respectively. The pulse data obtained from the oscilloscope are shown in FIG. 5. We can see that the amplitude of the device changes slowly with the change of the number of pulses. With the change of pulse width, the amplitude increase of the neuro-bionic device shows a different trend. However, when the pulse width is reduced to 10 ns, the device cannot be turned on for adjustment.

Figure 6:
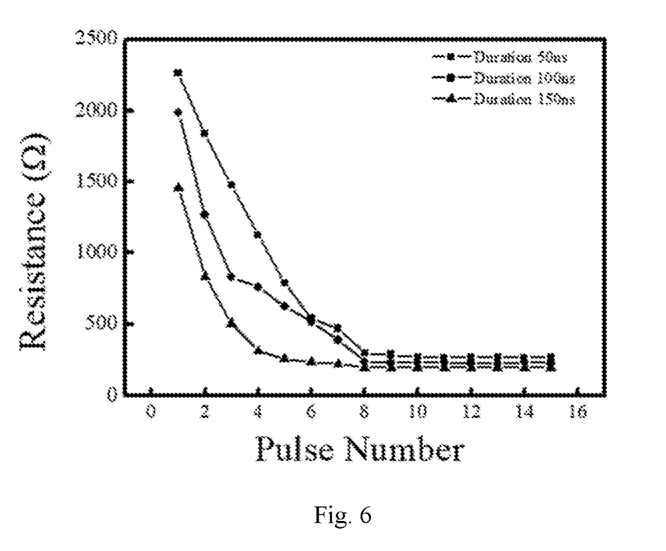
FIG. 6 is a diagram showing a change of a relationship between a resistance and a pulse scanning number of an Au electrode layer of contrast example 1 when applied with a series of pulse sequences with different pulse widths.

As shown in FIG. 6, the pulse sequence is continuously applied to the Au electrode layer of the neuro-bionic device in the contrast example 1. The same positive pulse sequence is applied to the Al electrode layer, and the amplitude is 6 V. The pulse widths are 50 ns, 100 ns and 150 ns, respectively. By the continuous pulse scanning, the resistance is reduced until the resistance is slowly reduced to a low-resistance state and remains stable. The figure shows the relationship between the resistance and the amplitude of the device. It can be seen that when the pulse width is gradually increased on the Au electrode layer of the device while other conditions remain unchanged, the number of pulses required for the device to change from high resistance to low resistance is different, thus the conductance changes obviously.

Figure 7:
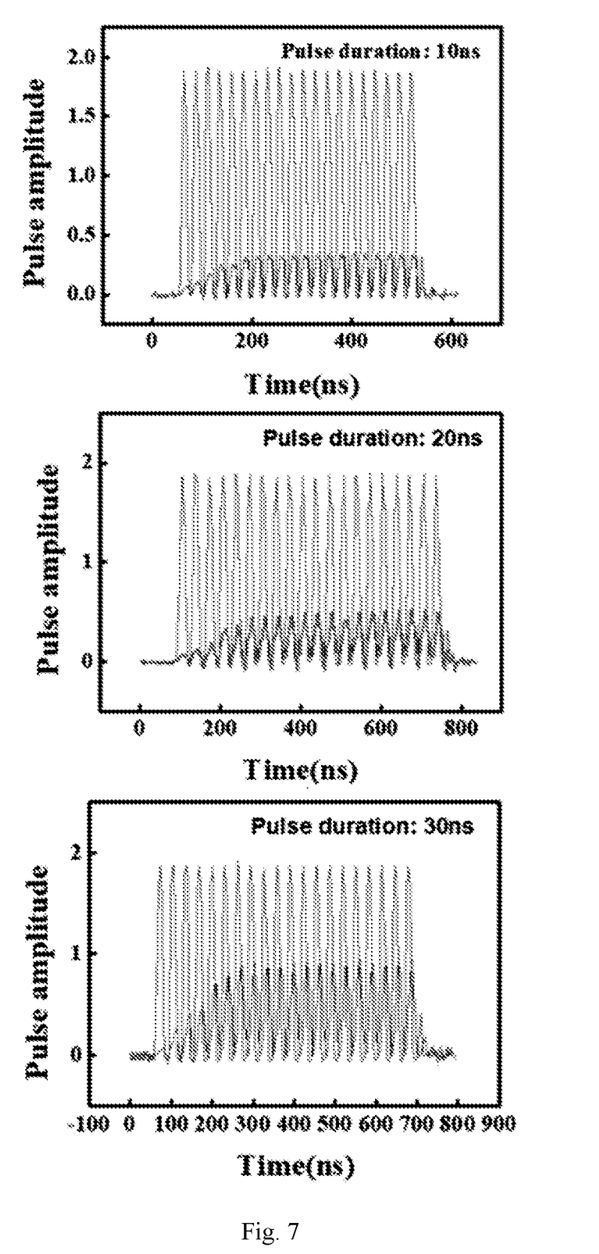
FIG. 7 shows a pulse waveform of an Al electrode layer of a neuro-bionic device of the present invention when applied with a series of pulse sequences with different pulse widths.
Figure 8:
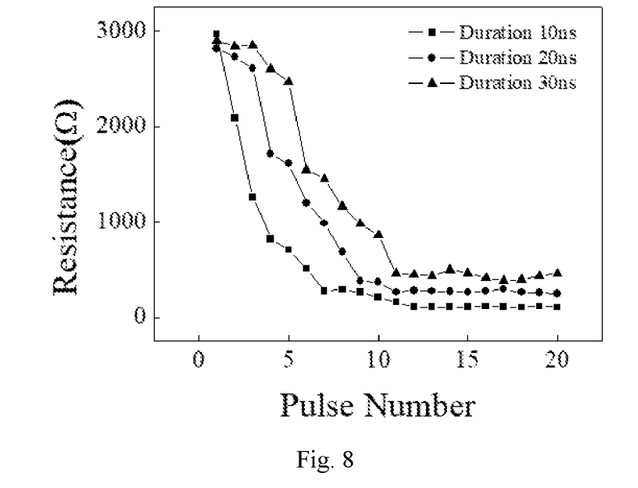
FIG. 8 is a diagram showing a change of a relationship between a resistance and a pulse sequence number of an Al electrode layer of a neuro-bionic device of the present invention when applied with a series of pulse sequences with different pulse widths.

The same pulse test is performed on the neuro-bionic device of Embodiment 1, as shown in FIG. 7 and FIG. 8. It is found that the amplitude of the neuro-bionic device using the Al electrode layer is reduced to 2 V. More importantly, the pulse interval of the pulse sequences can be reduced to 10 ns for continuous regulation, which is helpful for the application of ultrafast neural modulation.

As shown in FIG. 7, the continuous pulse sequences with different pulse widths of 10 ns, 20 ns and 30 ns are respectively applied to the Al electrode layer, the original pulse data are shown in FIG. 7.

As shown in FIG. 8, the pulse sequence is continuously applied to the Al electrode layer of the neuro-bionic device, and the amplitude and interval of the pulse sequence are 2 V and 10 ns, respectively. The pulse widths are 10 ns, 20 ns and 30 ns, respectively. By applying the pulse sequence, the resistance is slowly reduced to the low-resistance state and remains stable. FIG. 8 shows the relationship between the resistance value and the amplitude. When the pulse width is gradually increased on the Al electrode layer of the device while other conditions remain unchanged, the number of pulses required for the device to change from high resistance to low resistance is different, thus the conductance changes obviously. Moreover, it can be clearly seen that the device using the Al electrode can be modulated under a pulse sequence with a pulse width of 10 ns. This is beneficial to the application in the field of ultrafast neural bionics.

Figure 9:
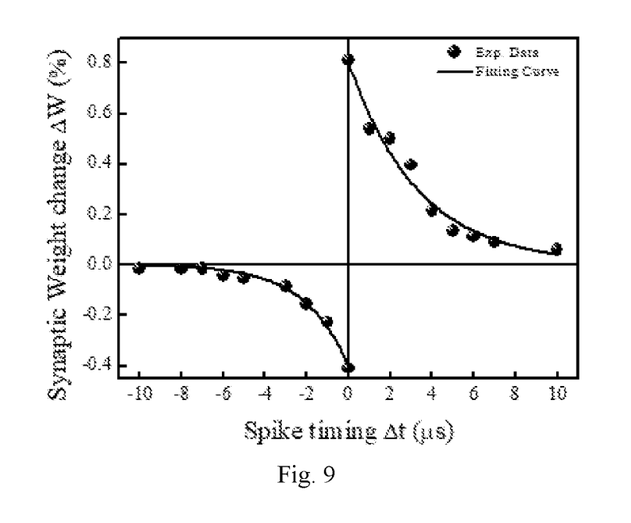
FIG. 9 shows a diagram of a simulation of a spike-timing dependent plasticity (STDP) by a neuro-bionic device of the present invention.

As shown in FIG. 9, the spike-timing dependent plasticity (STDP) of the neuro-bionic device is stimulated. Specifically, $\Delta t$ is the relative time difference between the pulse and the input and output neurons. When the pre-synaptic peak appears before the post-synaptic peak, $\Delta t>0$, the long-term potentiation (LTP) occurs. On the contrary, when the pre-synaptic peak appears after the post-synaptic peak, $\Delta t<0$, the long-term depression (LTD) occurs. FIG. 9 shows the relationship between synaptic weight $\Delta W$ and time interval $\Delta t$. $\Delta W$ is defined as the percentage change of the conductance of the device after the occurrence of STDP. Specifically, $\Delta W = G2-G1/G1 \times 100\%$. In addition, it can be seen from the diagram that the smaller the $\Delta t$, the greater the change of synaptic weight. In the present embodiment, the STDP function in the biological synapse is perfectly reproduced.

Figure 10:
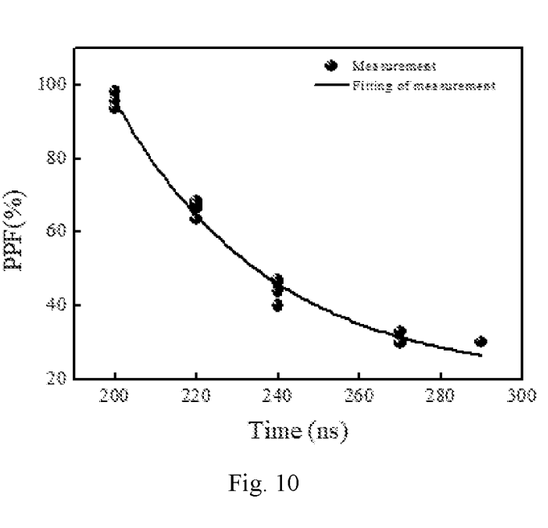
FIG. 10 shows a diagram of a simulation of a paired pulse facilitation (PPF) by a neuro-bionic device of the present invention.

As shown in FIG. 10, the paired pulse facilitation (PPF) of the neuro-bionic device is stimulated. The PPF curve in FIG. 10 is fitted by the following equation: $PPF=(G_2-G_1)/G_1 \times 100\% = C_1 \exp(-t/\tau_1) + C_2 \exp(-t/\tau_2)$. In this equation, $G_1$ and $G_2$ are the conductance values after the first and second pulses, respectively. The two fitting time constants, $\tau_1$ and $\tau_2$, correspond to the fast decaying and slow decaying, respectively, which are similar to the characteristic relaxation time observed in biological synapses. In the present embodiment, $\tau_1$ and $\tau_2$ are respectively equal to 392 ns and 400 ns. Therefore, the memory effect is enhanced by well controlling the pulse pair and decreasing the pulse interval, which is similar to the behavior of biological synapses.

We claim:

1. A neuro-bionic device, comprising:
    a Pt/Ti/SiO$_2$/Si substrate,
    a neuro-bionic layer formed directly on a Pt film layer of the Pt/Ti/SiO$_2$/Si substrate, the neuro-bionic layer is made of a two-dimensional Ti$_3$C$_2$ material, and
    an Al electrode layer formed directly on the neuro-bionic layer, the Al electrode layer comprises a plurality of circular electrodes uniformly distributed on the neuro-bionic layer, and a diameter of each circular electrode of the plurality of circular electrodes is 80 µm-300 µm;
    wherein the neuro-bionic device is an electronic artificial synapse device configured to provide spike-timing-dependent plasticity and paired pulse facilitation.

2. The neuro-bionic device according to claim 1, wherein the neuro-bionic layer is prepared by a drop-coating method, and a thickness of the neuro-bionic layer is 5 nm-200 nm.

3. The neuro-bionic device according to claim 1, wherein the Al electrode layer is prepared by an evaporation method and the diameter of each circular electrode of the plurality of circular electrodes is 90 µm.

4. The neuro-bionic device according to claim 3, wherein a thickness of each of the plurality of circular electrodes is 50 nm-200 nm.

5. The neuro-bionic device according to claim 1 wherein the Pt/Ti/SiO$_2$/Si substrate comprises a Si layer, a SiO$_2$ layer, a Ti layer and a Pt film layer from bottom to top.

6. The neuro-bionic device according to claim 1, wherein the Al electrode layer is configured to simulate a pre-synaptic membrane of a synapse.

7. The neuro-bionic device according to claim 1, wherein the Pt film layer is configured to simulate a post-synaptic membrane of the synapse.

8. The neuro-bionic device according to claim 1, wherein the artificial synapse device is configured to be controlled by applying a series of pulse sequences with different amplitudes and widths.

* * * * *